(12) United States Patent
Cheng

(10) Patent No.: US 7,498,210 B2
(45) Date of Patent: Mar. 3, 2009

(54) LTPS-LCD STRUCTURE AND METHOD FOR MANUFACTURING THE SAME

(75) Inventor: Yi-Sheng Cheng, Jhubei (TW)

(73) Assignee: Au Optronics Corp., Hsinchu (TW)

( * ) Notice: Subject to any disclaimer, the term of this patent is extended or adjusted under 35 U.S.C. 154(b) by 267 days.

(21) Appl. No.: 11/550,438

(22) Filed: Oct. 18, 2006

(65) Prior Publication Data

US 2008/0020519 A1   Jan. 24, 2008

(30) Foreign Application Priority Data

Jul. 21, 2006   (TW) ................. 95126657 A

(51) Int. Cl.
*H01L 21/84* (2006.01)
(52) U.S. Cl. ................. 438/155; 257/E21.704
(58) Field of Classification Search ................. 438/153, 438/155; 257/E21.704
See application file for complete search history.

(56) References Cited

U.S. PATENT DOCUMENTS

| 6,800,510 B2 * | 10/2004 | Peng et al. ................. 438/149 |
| 6,822,263 B2 * | 11/2004 | Satou et al. ................. 257/59 |
| 7,088,401 B1 | 8/2006 | Ihara et al. |

* cited by examiner

*Primary Examiner*—Chandra Chaudhari
(74) *Attorney, Agent, or Firm*—Thomas, Kayden, Horstemeyer & Risley

(57) ABSTRACT

An LTPS-LCD structure and a method for manufacturing the structure are provided. The structure comprises a substrate where a plurality of pixels are formed thereon. Each of these pixels comprises a control area, a capacitance area, and a display area. The structure is initially formed with a transparent electrode on the substrate, followed by a control device, a capacitance storage device. The display unit is then formed on the control area, the capacitance area, and the display area, respectively. As a result, the capacitance of the structure can be enhanced and the manufacturing processes of masks can be reduced.

8 Claims, 8 Drawing Sheets

LTPS-LCD STRUCTURE AND METHOD FOR MANUFACTURING THE SAME

This application claims the benefits of Taiwan Patent Application No. 095126657, filed Jul. 21, 2006, the contents of which are herein incorporated by reference in its entirety.

CROSS-REFERENCES TO RELATED APPLICATIONS

Not applicable.

BACKGROUND OF THE INVENTION

1. Field of the Invention

The present invention relates to an LCD structure and a method for manufacturing the structure. In particular, the invention relates to an LTPS-TFT LCD structure and a method for manufacturing the structure to reduce photolithography processes with masks and simultaneously enhance pixel capacitance.

2. Descriptions of the Related Art

Liquid crystal displays (LCDs) are mainstream products on the display market. Not only do LCDs save power and emit low radiation, they are also lightweight and portable. Technologies of thin-film-transistor LCD (TFT-LCD) can be classified into two groups: amorphous silicon ($\alpha$-Si) and poly-silicon (Poly-Si). The technology and techniques of $\alpha$-Si are fully developed and frequently used in TFT-LCDs on the display market.

However, low temperature poly silicon (LTPS) is a recent and novel technology for manufacturing Poly-Si LCDs. In comparison with conventional $\alpha$-Si LCDs, carrier mobility on the LTPS TFT is at least two hundred times higher than that on the $\alpha$-Si TFT due to its characteristics. The displays which utilize LTPS technology also have higher performance, with shorter response time and greater brightness, resolution, and color saturation. Therefore, LTPS-LCD can present images with higher display quality. Moreover, the physical structure and elements in the LTPS-LCDs can be minimized, so the TFT module area is at least 50% smaller. Thus, LTPS-LCDs can be thinner and lighter to reduce power exhausting. The size advantage of the TFT modules also reduces manufacturing costs of the LTPS-LCDs as well. Because of the many advantages present by LTPS technology, LTPS-LCDs attract lots of attentions on the LCD market.

In the conventional LTPS photolithography manufacturing processes, six masks are usually involved. These processes for manufacturing an LPTS display structure 10 are outlined in FIGS. 1A~1F. For illustration, a TFT 11 and a capacitance storage device 13 are merely shown in the figures. Firstly, FIG. 1A shows the photolithography process with the first mask. Poly-silicon islands 110, 130 are formed onto a substrate 100 to function as fundamental materials for the TFT 11 and the capacitance storage device 13.

Referring to FIG. 1B, the photolithography process with the second mask is illustrated. A lower insulator layer 12 is formed to cover the aforesaid poly-silicon islands 110, 130. Then, first conductive layers 113, 133 are respectively formed on the lower insulator layer 12. Subsequently, as shown the arrows in FIG. 1B, the poly-silicon islands 110 are doped with P+ and P− ions to turn into a source/drain structure.

After that, as shown in FIG. 1C, an upper insulator layer 14 covers the aforesaid first conductive layer 113, 133 and the lower insulator layer 12. Two contact holes 141 are then formed by the photolithography process with the third mask. The contact holes 141 are utilized to expose the source/drain structure for following electrical conduction.

The photolithography process with the fourth mask is shown in FIG. 1D. Second conductive layers 115, 135 are formed, in which the second conductive layer 115 connects the source/drain structure within the contact hole 141. The other second conductive layer 135 is correspondingly formed above the first conductive layer 133. As a result, a MIM (metal-insulator-metal) capacitance is formed between the first conductive layer 133 and the second conductive layer 135.

Referring to FIG. 1E, a passivation layer 16 is formed to cover the above mentioned elements. Then, the photolithography process with the fifth mask can be proceeded to form a contact hole 161 for partially exposing the second conductive layer 115 which is connecting with the drain structure.

Finally, a transparent electrode 17 is formed by the photolithography process with the sixth mask. The transparent electrode 17 electrically connects with the second conductive layer 115 at the contact hole 161 and further connects to a display area (not shown) of the pixel for providing the required electric fields.

However, the conventional LTPS display structure 10 still has disadvantageous limitations. As shown in FIG. 1B, the poly-silicon island 130 that is sheltered from the first conductive layer 133 cannot be doped during the doping process. Consequently, the final product would not have any effective capacitance between the first conductive layer 133 and the poly-silicon island 130. As a result, the capacitance provided from the display structure 10 is substantially reduced. Furthermore, because of the complicated manufacturing processes of the conventional structure, more photolithography processes with masks are required, raising the cost of manufacturing.

Given the above, an LTPS-LCD structure which can be made from simplified photolithography processes and promote capacitances needs to be developed in this field.

SUMMARY OF THE INVENTION

The primary objective of this invention is to provide an LTPS-LCD structure. By previously disposing a transparent electrode on the bottom of the display structure, an effective capacitance can be generated within the un-doped poly-silicon area. Thus, the capacitance of the final product can be promoted to benefit effective operation of the display structure.

Another objective of this invention is to provide a method for manufacturing the LTPS-LCD structure. By disposing the transparent electrode during the previous photolithography process, the processes for manufacturing the entire TFT and capacitance storage device can be simplified to effectively economize costs and shorten manufacturing periods.

To achieve the aforementioned objectives, an LTPS-LCD structure is provided in the present invention. The structure comprises a substrate, a transparent electrode, a lower insulator layer, a control device, a first conductive layer, an upper insulator layer, and a second conductive layer. The substrate is formed with a plurality of pixel areas each including a control area, a capacitance area, and a display area. The transparent electrode is formed on the substrate that corresponds to the display area, the control area, and the capacitance area. The lower insulator layer is formed on the transparent electrode that corresponds to the control area. The control device is formed on the lower insulator layer that corresponds to the control area. The first conductive layer is partially formed on the control device and the transparent electrode that corresponds to the control area and the capacitance area respectively. The upper insulator layer at least partially covers the control device and the first conductive layer. The second conductive layer at least partially covers the upper insulator layer for forming a capacitance storage device with the first conductive layer on the capacitance area, whereby it electrically connects the control device to the transparent electrode disposed on the display area.

A method for manufacturing the aforementioned LTPS-LCD structure is also provided in the present invention. The method comprises the following steps: forming the transparent electrode on the display area, the control area, and the capacitance area of the substrate; forming a silicon-oxide insulator layer that corresponds to the control area; locally forming a first conductive layer on the silicon-oxide insulator layer and the transparent electrode that corresponds to the control area and the capacitance area, and forming the control device on the control area; forming an upper insulator layer which at least partially covering the control device and the first conductive layer; and forming a second conductive layer which at least partially covering the upper insulator layer to form a capacitance storage device with the first conductive layer.

The detailed technology and preferred embodiments implemented for the subject invention are described in the following paragraphs accompanying the appended figures for people skilled in this field to well appreciate the features of the claimed invention.

DESCRIPTION OF THE PREFERRED EMBODIMENT

Figure 4:
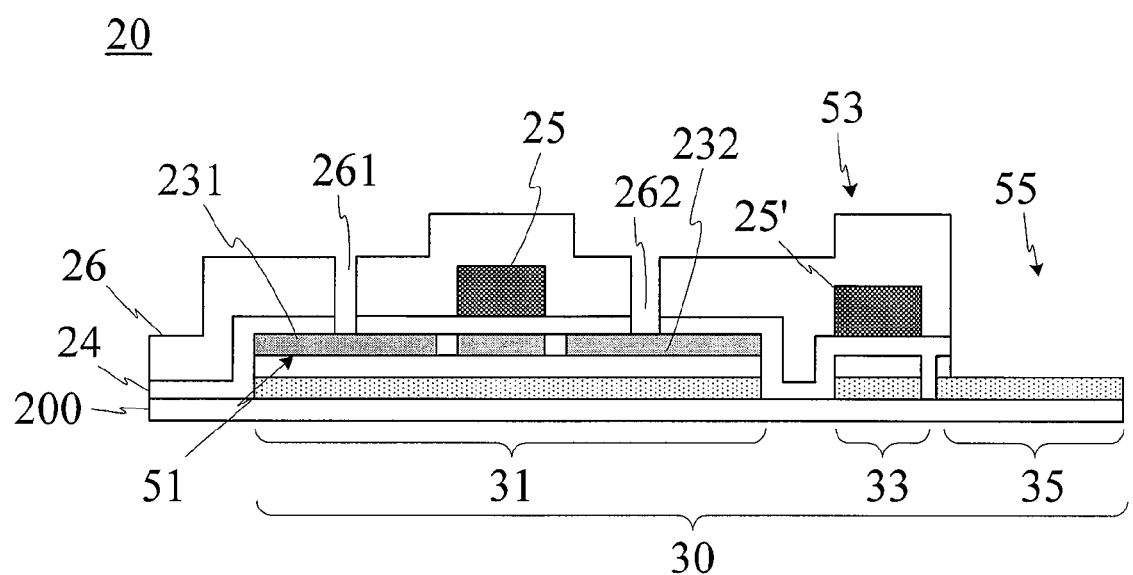
FIG. 4 is a schematic view illustrating the photolithography process with the third mask of the preferred embodiment of the present invention.
Figure 5:
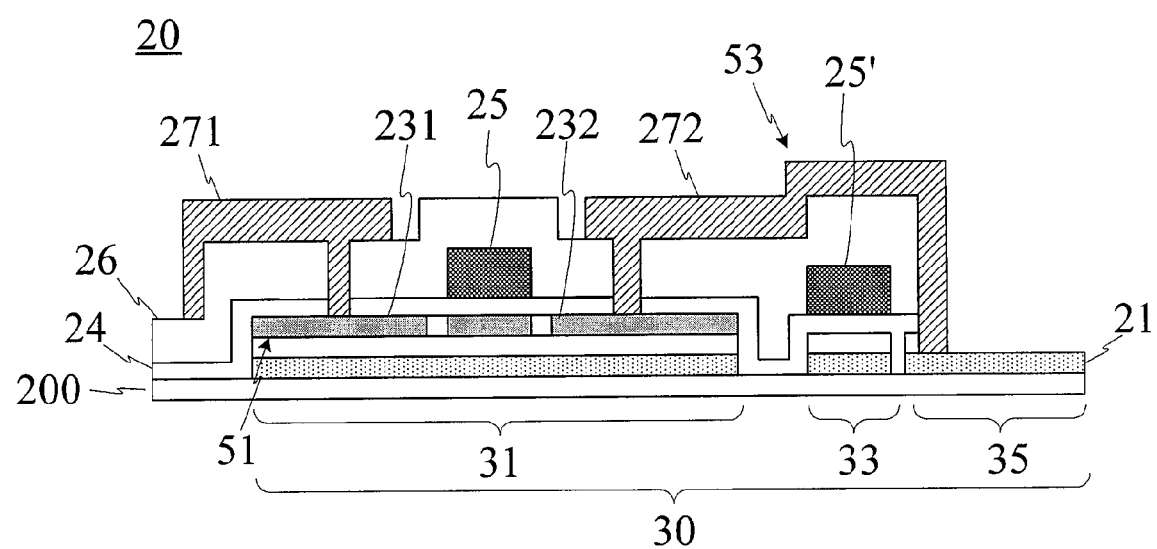
FIG. 5 is a schematic view illustrating the photolithography process with the fourth mask of the preferred embodiment of the present invention.
Figure 6:
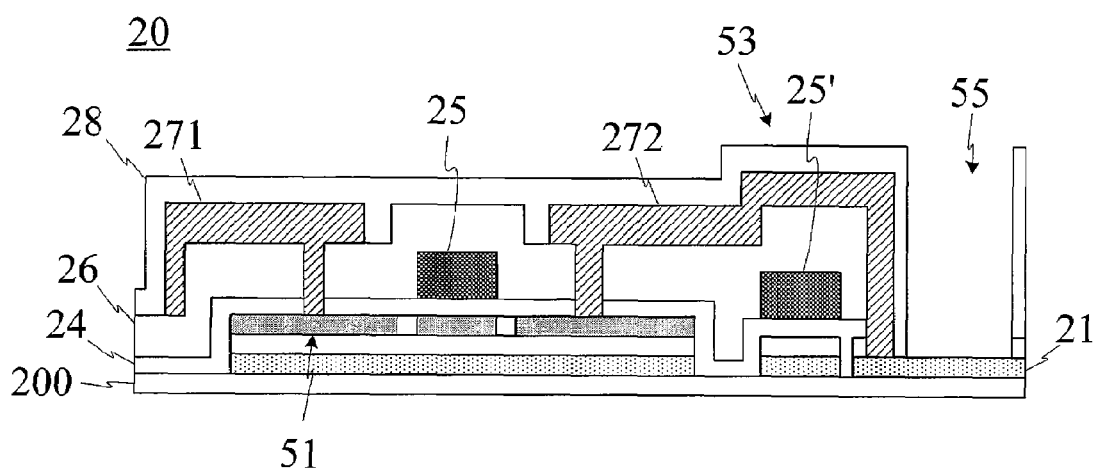
FIG. 6 is a schematic view illustrating the photolithography process with the fifth mask of the preferred embodiment of the present invention.

A preferred embodiment of the LTPS-LCD structure of the present invention is shown in FIG. 6, and preferred processes for manufacturing the structure are shown from FIG. 2A through FIG. 6.

Figure 1A:
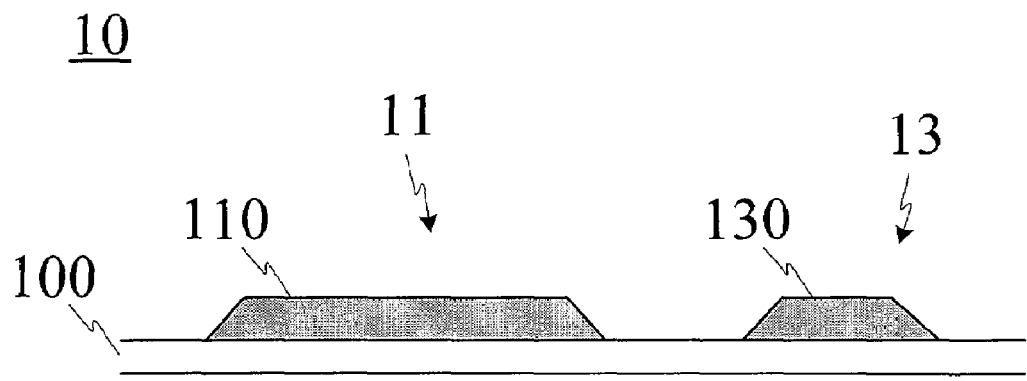
FIGS. 1A to 1F are schematic views illustrating the manufacturing processes of the conventional LTPS display structure.
Figure 1B:
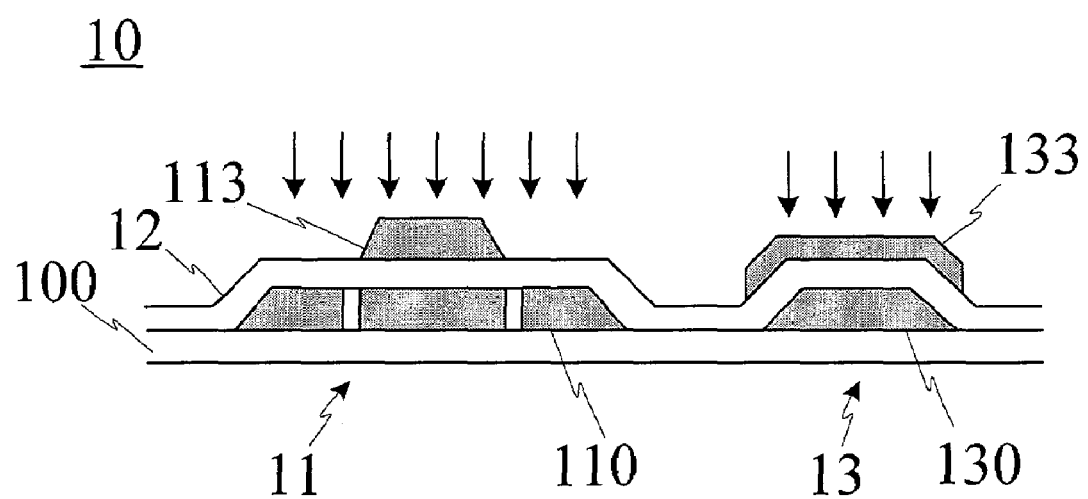
Figure 1C:
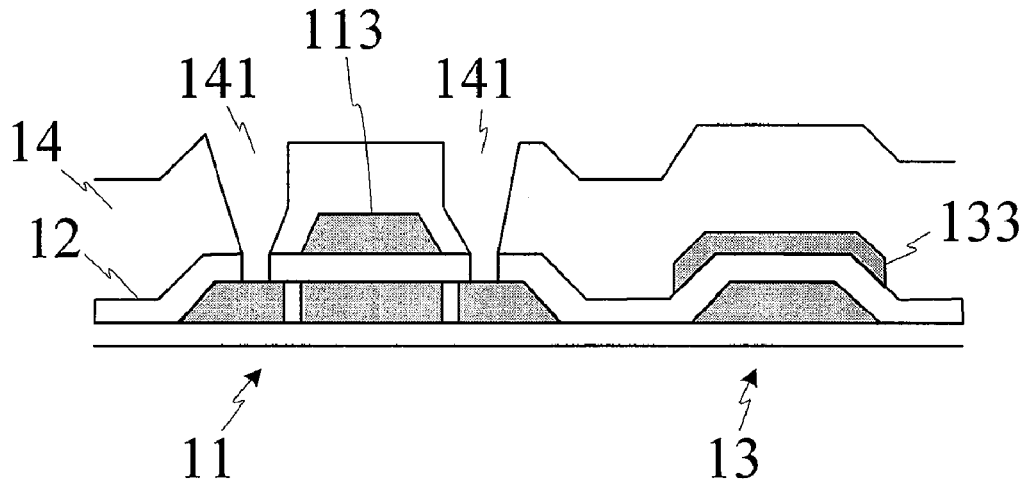
Figure 1D:
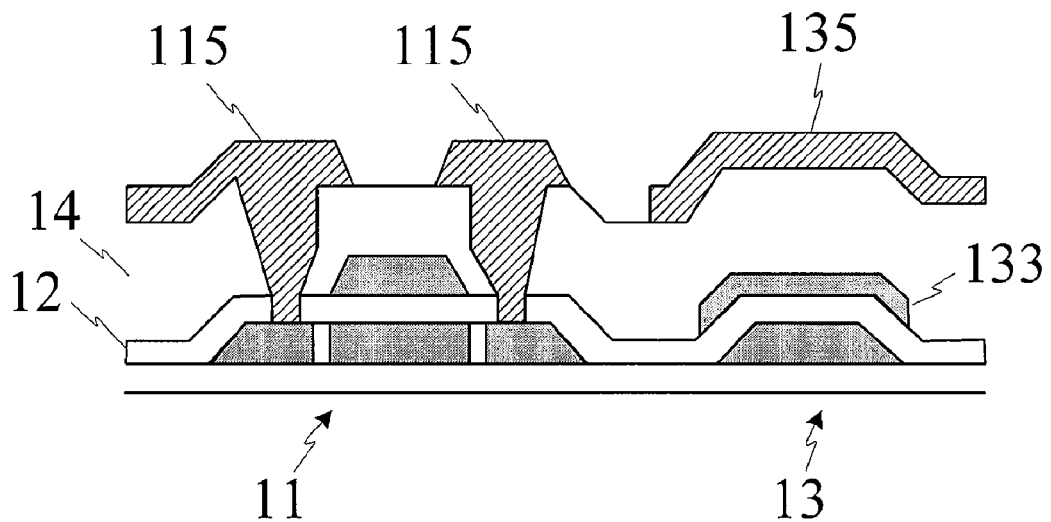
Figure 1E:
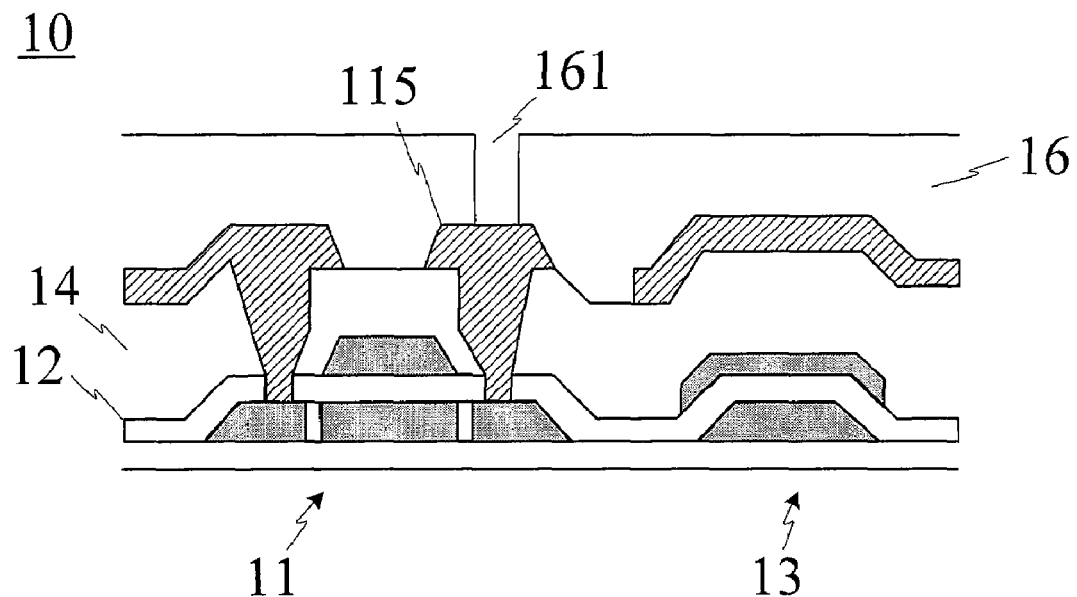
Figure 1F:
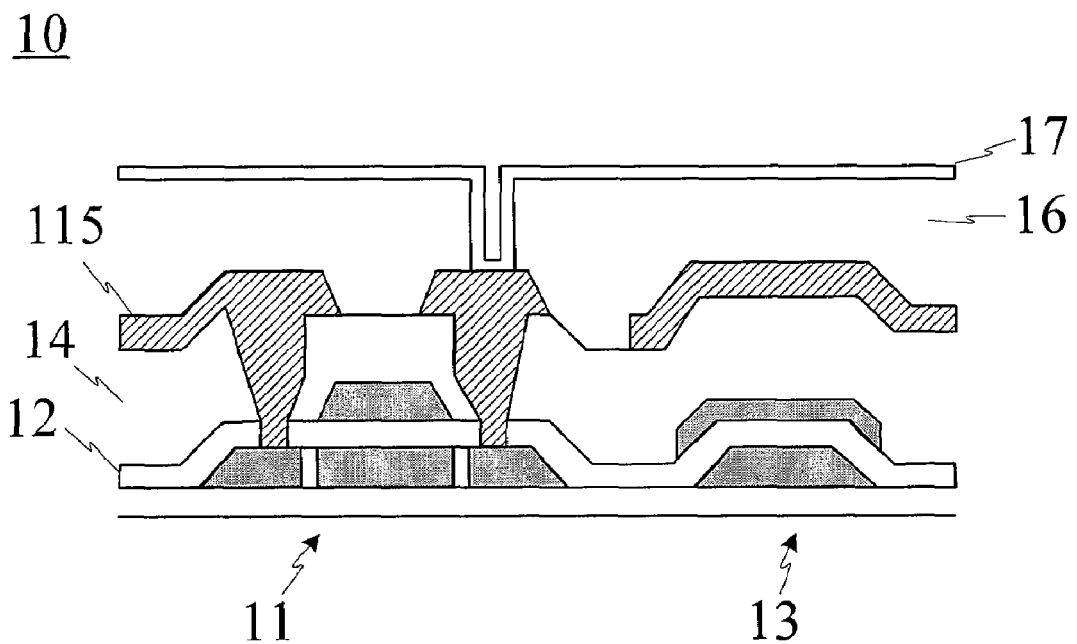
Figure 2A:
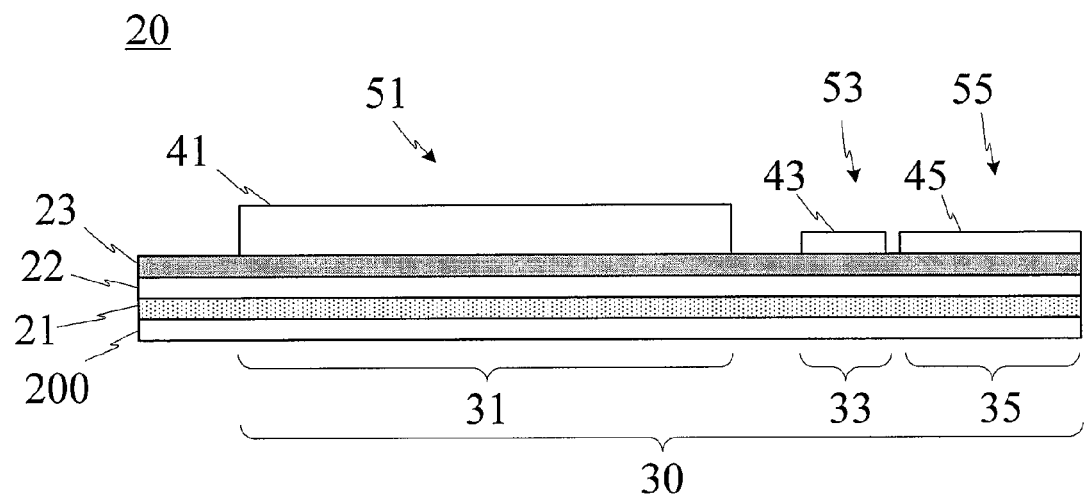
FIGS. 2A and 2B are schematic views illustrating the photolithography process with the first mask of a preferred embodiment of the present invention.
Figure 2B:
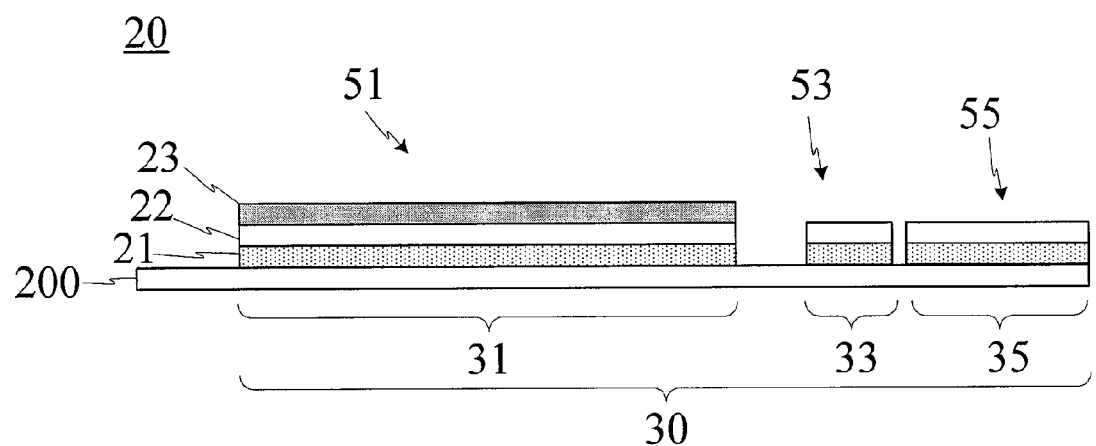

The LTPS-LCD structure 20 of the present invention comprises a control device 51, a capacitance storage device 53, and a pixel unit 55. Referring to FIGS. 2A and 2B, the structure 20 comprises a substrate 200 which is formed with a plurality of pixel areas. To specifically disclose the present invention, only a pixel area 30 is representatively shown in the figures. Each pixel area 30 includes a control area 31, a capacitance area 33, and a display area 35.

As shown in FIG. 2B, a transparent electrode 21 is previously formed on the control area 31, the capacitance area 33, and the display area 35 of the substrate 200. Preferably, the transparent electrode 21 is made of Indium Tin Oxide (ITO). Then, a silicon-oxide insulator layer 22 (or namely a lower insulator layer) is formed on the transparent electrode 21 that corresponds to the control area 31. A poly-silicon layer 23 is then formed on the silicon-oxide insulator layer 22, wherein the silicon-oxide insulator layer 22 and the poly-silicon layer 23 are formed with a predetermined pattern.

In FIG. 2A, the above-mentioned manufacturing process is illustrated more specifically. The transparent electrode 21, the silicon-oxide insulator layer 22, and the poly-silicon layer 23 are successively formed on the substrate 200, and a photolithography (etching) process is subsequently performed. That is to say, the silicon-oxide insulator layer 22 is also formed on the transparent electrode 21 that corresponds to the capacitance area 33 and the display area 35. Similarly, the poly-silicon layer 23 is also formed on the silicon-oxide insulator layer 22 that corresponds to the control area 31, the capacitance area 33, and the display area 35.

Subsequently, photo-resist layers 41, 43, 45 are respectively disposed onto the poly-silicon layer 23 corresponding to the control area 31, the capacitance area 33, and the display area 35. Preferably, the photo-resist layers 41, 43, 45 are made from a half-tone mask. It is further noted that the photo-resist layers 41, 43, 45 have different predetermined thicknesses due to the half-tone mask process. For example, a photolithography process with the first mask of the present invention is provided by etching the photo-resist layer 41 which has a greater thickness. Because the photo-resist layers 43 and 45 are thinner, the poly-silicon layer 23 and the silicon-oxide insulator layer 22 on the display area 35 can be removed with etching, leaving only the transparent electrode 21. Similarly, the poly-silicon layer 23 on the capacitance area 33 can be removed as well. Preferably, due to the specific thickness of the photo-resist layer 43, the silicon-oxide insulator layer 22 on the capacitance area 22 can be removed completely after etching. As a result of these processes, the capacitance storage device 53 of the final product can have a higher capacitance.

Figure 3:
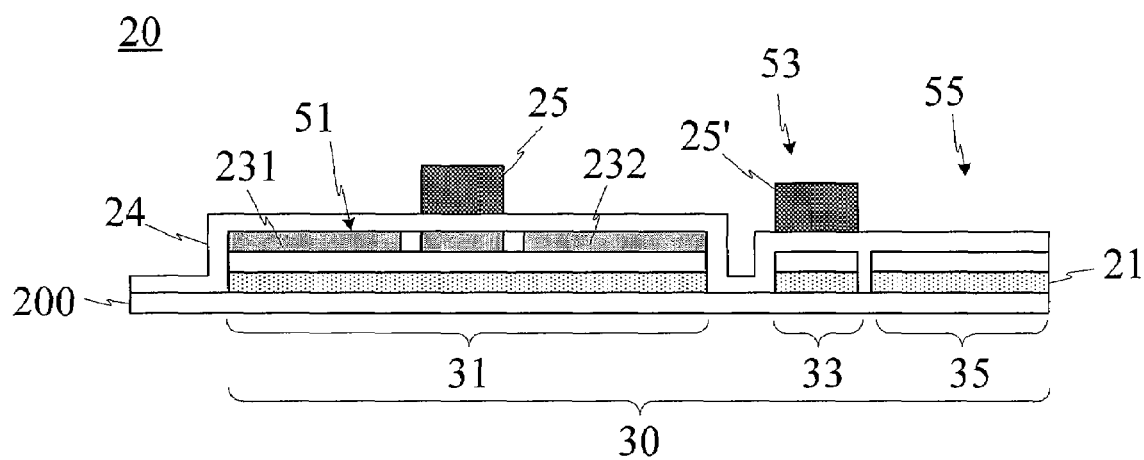
FIG. 3 is a schematic view illustrating the photolithography process with the second mask of the preferred embodiment of the present invention.

With reference to FIG. 3, first conductive layers 25, 25' are partially formed on the transparent electrode 21 that corresponds to the control area 31 and the capacitance area 33. In this case, the first conductive layer 25 is formed as a gate structure on the control area 31. More specifically, a mid-insulator layer 24 is previously formed that corresponds to the control area 31, the capacitance area 33, and the display area 35. Then, the photolithography process with the second mask of the present invention is performed. The first conductive layers 25, 25' are respectively formed that corresponds to the control area 31 and the capacitance area 33. Finally, the control device 51 is doped into a source electrode 231 and a drain electrode 232 on the control area 31. Preferably, the control device 51 is partially performed with a lightly doped drain (LDD) process to form an LDD structure for higher conductivity.

Following the aforesaid processes, an upper insulator layer 26 is formed as shown in FIG. 4. The upper insulator layer 26 at least partially covers the control device 51 and the first conductive layers 25, 25'. Furthermore, the upper insulator layer 26 is formed to cover the aforesaid elements. Then, two contact holes 261, 262 are formed by a photolithography process with the third mask. The source electrode 231 and the drain electrode 232 can be exposed from the upper insulator layer 26 and the mid-insulator layer 24 for electrical connection.

The photolithography process with the fourth mask of the present invention is shown in FIG. 5. According to the above-mentioned structure, second conductive layers 271, 272 are formed to at least partially cover the upper insulator layer 26. Accordingly, the capacitance storage device 53 is formed between the second conductive layer 272 and the first conductive layer 25', and the control device 51 is electrically connected to the transparent electrode 21 on the display area 35 to form the required electric fields. More specifically, the second conductive layers 271, 272 connect onto the source electrode 231 and the drain electrode 232 of the control device 51 through the contact holes 261, 262 in the upper insulator layer 26 and the mid-insulator layer 24.

Finally, as shown in FIG. 6, the photolithography process with the fifth mask of the present invention forms a passivation layer 28 to cover the LTPS-LCD structure 20 on the second conductive layer 271, 272.

In accordance with the aforesaid manufacturing processes, the LTPS-LCD structure 20 of the present invention is obtained. On the control area 31, the structure 20 successively comprises the substrate 200, the transparent electrode 21, the lower insulator layer 22, the control device 51, the mid-insulator layer 24, the first conductive layer 25, the upper insulator layer 26, the second conductive layer 271, and the passivation layer 28. On the capacitance area 33, preferably, the structure 20 successively comprises the substrate 200, the transparent electrode 21, the mid-insulator layer 24, the first conductive layer 25', the upper insulator layer 26, the second conductive layer 272, and the passivation layer 28. However, on the display area, only the substrate 200 and the transparent electrode 21 remain.

Specifically, the lower insulator layer 22 is formed on the transparent electrode 21 to correspond to the control area 31 and the capacitance area 33. Alternatively, the lower insulator layer 22 can simply be formed on the control area 31 to generate a higher capacitance without the lower insulator layer 22 on the capacitance area 33. Corresponding to the control area 31, the control device 51 is formed on the lower insulator layer 22. Preferably, the mid-insulator layer 24 is disposed under the first conductive layers 271, 272. That is to say, the first conductive layer 271, 272 are partially formed on the control device 51 and the transparent electrode 21 that corresponds to the control area 31 and the capacitance area 33, respectively. The upper insulator layer 26 at least partially covers the control device 51 and the first conductive layers 25, 25'. The second conductive layers 271, 272 at least partially cover the upper insulator layer 26, to form the capacitance storage device 53 with the first conductive layer 25' and electrically connect the control device 51 to the transparent electrode 21 on the display area 55.

Preferably, the control device 51 is a thin-film-transistor (TFT) and the lower insulator layer 22 can be the silicon-oxide insulator layer 22. The passivation layer 28 completely covers the second conductive layer 271, 272.

According to the above-mentioned LTPS-LCD structure 20 of the present invention, the transparent electrode 21 is previously formed on the substrate 200. This structure can not only enhance the efficiency of the capacitance storage device, but can also diminish the number of steps within the photolithography processes or etching processes with masks from six to five. This can substantially reduce costs and shorten manufacturing processes.

The above disclosure is related to the detailed technical contents and inventive features thereof. People skilled in this field may proceed with a variety of modifications and replacements based on the disclosures and suggestions of the invention as described without departing from the characteristics thereof. Although such modifications and replacements are not fully disclosed in the above descriptions, they have substantially been covered in the following claims as appended.

What is claimed is:

1. A method for manufacturing an LTPS-LCD structure, the structure comprising a substrate which is formed with a plurality of pixel areas each including a control area, a capacitance area, and a display area; the method comprising the steps of:
    (a) forming a transparent electrode on the display area, the control area, and the capacitance area of the substrate, and forming a silicon-oxide insulator layer on the transparent electrode to correspond to the control area;
    (b) locally forming a first conductive layer on the silicon-oxide insulator layer and the transparent electrode to correspond to the control area and the capacitance area, respectively, and forming a control device on the control area;
    (c) forming an upper insulator layer which at least partially covering the control device and the first conductive layer; and then
    (d) forming a second conductive layer which at least partially covering the upper insulator layer to form a capacitance storage device with the first conductive layer, whereby electrically connects the control device to the transparent electrode disposed on the display area.

2. The method as claimed in claim 1, in which after the step (d) further comprises the step of:
    (e) forming a passivation layer covering the second conductive layer.

3. The method as claimed in claim 1, wherein the step (a) further comprises the steps of:
    (a-1) forming a silicon-oxide insulator layer on the transparent electrode to correspond to the capacitance area and the display area; and then
    (a-2) forming a poly-silicon layer on the silicon-oxide insulator layer to correspond to the control area, the capacitance area, and the display area.

4. The method as claimed in claim 3, wherein the silicon-oxide insulator layer and the poly-silicon layer forms a predetermined pattern which is formed by the step of:
    (a-3) etching a photo-resist layer which is disposed on the poly-silicon layer to correspond to the control area, the capacitance area, and the display area.

5. The method as claimed in claim 4, the step (a-3) employs a half-tone mask process.

6. The method as claimed in claim 4, wherein the step (b) further comprises the steps of:
    (b-1) forming a mid-insulator layer to correspond to the control area, the capacitance area, and the display area;
    (b-2) forming the first conductive layer to correspond to the control area and the capacitance area;
    (b-3) doping the control device to form a source electrode and a drain electrode; and
    (b-4) doping the control device to form a low doped structure thereof.

7. The method as claimed in claim 6, wherein the step (c) further comprises the step of:
    (c-1) exposing the source electrode and the drain electrode from the upper insulator layer and the mid-insulator layer.

8. The method as claimed in claim 7, wherein in the step (d), the second conductive layer connects the control device onto the source electrode and the drain electrode through the upper insulator layer and the mid-insulator layer.

* * * * *